US007011928B2

(12) United States Patent
Takamuki

(10) Patent No.: US 7,011,928 B2
(45) Date of Patent: Mar. 14, 2006

(54) IMAGE FORMATION METHOD OF PLANOGRAPHIC PRINTING PLATE MATERIAL

(75) Inventor: Yasuhiko Takamuki, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 12 days.

(21) Appl. No.: 10/758,766

(22) Filed: Jan. 16, 2004

(65) Prior Publication Data

US 2004/0157153 A1 Aug. 12, 2004

(30) Foreign Application Priority Data

Feb. 5, 2003 (JP) ............................ 2003-028053

(51) Int. Cl.

| | |
|---|---|
| ***G03F 7/028*** | (2006.01) |
| ***G03F 7/09*** | (2006.01) |
| ***G03F 7/14*** | (2006.01) |
| ***G03F 7/20*** | (2006.01) |

(52) U.S. Cl. ................ 430/302; 430/271.1; 430/273.1; 430/494; 430/926

(58) Field of Classification Search ............ 430/271.1, 430/273.1, 302, 494, 944, 945, 926; 101/463.1
See application file for complete search history.

(56) References Cited

U.S. PATENT DOCUMENTS

2003/0198893 A1 * 10/2003 Oshima .................. 430/273.1

FOREIGN PATENT DOCUMENTS

| | | | |
|---|---|---|---|
| EP | 0 985 683 A1 | | 3/2000 |
| EP | 1 148 387 A1 | | 10/2001 |
| JP | 2004295024 A | * | 10/2004 |

* cited by examiner

*Primary Examiner*—Richard L. Schilling
(74) *Attorney, Agent, or Firm*—Lucas & Mercanti LLP

(57) ABSTRACT

Disclosed is a method of forming an image on a light sensitive planographic printing plate material comprising a hydrophilic support and provided thereon, a light sensitive layer containing an addition polymerizable ethylenically unsaturated monomer, a photopolymerization initiator, a polymer binder, and a sensitizing dye having an absorption maximum in the wavelength regions of from 390 to 430 nm, the minimum laser exposure amount necessary to form an image on the material being from 1.0 to 100 $\mu J/cm^2$, the method comprising the step of imagewise exposing the light sensitive planographic printing plate material to laser under a non-yellow safelight to form an image, the non-yellow safelight having an optical filter cutting out light with a wavelength of less than 440 nm, and satisfying the following expression:

$$0.800 < I/I_{700} < 1.00.$$

10 Claims, No Drawings

IMAGE FORMATION METHOD OF PLANOGRAPHIC PRINTING PLATE MATERIAL

FIELD OF THE INVENTION

The present invention relates to a method of forming an image on a light sensitive planographic printing plate material, and particularly to a method capable of forming an image on a light sensitive planographic printing plate material under room light close to white light.

BACKGROUND OF THE INVENTION

A printing plate material for CTP capable of recording digital data employing a laser beam is required to be more highly light-sensitive for the purpose of carrying out recording in a short time. Further, recently, there has been a strong demand for processing (room light processing) under yellow light or white light, instead of processing in a dark room.

At present, a compact and high power laser emitting a blue-violet light with a short wavelength of from 390 to 430 nm has become available on the market, and a light sensitive planographic printing plate material suitable for this laser has been developed, which enables room light processing (see for example, Japanese Patent O.P.I. Publication Nos. 2000-98605, pages 2 and 3, sections 0005 to 0010, 2000-147763, page 3, sections 0006 to 0014, and 2002-202594, pages 2 and 3, sections 0004 and 0005.).

Since the yellow or yellow-orange light provides sufficient brightness, it is considered that there is no problem in these techniques with regard to workability under that kind of light. However, the yellow or yellow-orange light environment is psychologically undesired for operators worker, and therefore, an environment closer to white light has been desired.

SUMMARY OF THE INVENTION

The present invention has been made in view of the above. An object of the invention is to provide a method capable of forming an image on a light sensitive planographic printing plate material with high sensitivity under room light close to white light.

DETAILED DESCRIPTION OF THE INVENTION

The above objects of the invention can be attained by the followings:

1. A method of forming an image on a light sensitive planographic printing plate material comprising a hydrophilic support and provided thereon, a light sensitive layer containing an addition polymerizable ethylenically unsaturated monomer, a photopolymerization initiator, a polymer binder, and a sensitizing dye having an absorption maximum in the wavelength regions of from 390 to 430 nm, the minimum laser exposure amount necessary to form an image on the material being from 1.0 to 100 $\mu J/cm^2$, the method comprising the step of imagewise exposing the light sensitive planographic printing plate material to laser under a non-yellow safelight to form an image, the non-yellow safelight having an optical filter cutting out light with a wavelength of less than 440 nm, and satisfying the following expression:

$$0.800 \leq I/I_{700} < 1.00$$

wherein $I_{700}$ represents a transmittance of light with a wavelength of 700 nm, and I represents a transmittance of light with a wavelength of from 440 nm to less than 700 nm.

2. The method of item 1 above, wherein the laser is a blue-violet semi-conductor laser emitting light with a wavelength of from 390 to 430 nm.

3. The method of item 1 above, wherein the photopolymerization initiator is a monoalkyltriarylborate compound.

4. The method of item 1 above, wherein the photopolymerization initiator is an iron arene complex.

5. The method of item 1 above, wherein the photopolymerization initiator is a bromine-containing compound represented by the following formula 1:

$$R_1—CBr_2—(C{=}O)—R_2 \qquad \text{Formula 1}$$

wherein $R_1$ represents a hydrogen atom, a bromine atom, an alkyl group, an aryl group, an acyl group, an alkylsulfonyl group, an arylsulfonyl group or a cyano group; and $R_2$ represents a monovalent substituent, provided that $R_1$ and $R_2$ may combine with each other to form a ring.

6. The method of item 5 above, wherein the formula 1 is represented by the following formula 2:

$$CBr_3—(C{=}O)—X—R_3 \qquad \text{Formula 2}$$

wherein $R_3$ represents a monovalent substituent; and X represents —O— or —$NR_4$—, in which $R_4$ represents a hydrogen atom or an alkyl group, provided that $R_3$ and $R_4$ may combine with each other to form a ring.

7. The method of item 1 above, wherein an addition polymerizable ethylenically unsaturated monomer has a tertiary amino group in the molecule.

8. The method of item 1 above, wherein an addition polymerizable ethylenically unsaturated monomer is a reaction product of a polyhydric alcohol having a tertiary amino group in the molecule, a diisocyanate compound and a compound having in the molecule a hydroxyl group and an addition polymerizable ethylenically double bond.

9. The method of item 1 above, wherein the sensitizing dye is a difluoro(2-acylphenoxy)borane compound.

10. The method of item 1 above, wherein the light sensitive planographic printing plate material has an overcoat layer containing a dyestuff on the light sensitive layer, the overcoat layer having an absorption maximum in the wavelength regions exceeding 420 nm, and being transparent to laser used in the imagewise exposure.

1-1. A method of forming an image on a light sensitive planographic printing plate material comprising a hydrophilic support and provided thereon, a light sensitive layer containing an addition polymerizable ethylenically unsaturated monomer, a photopolymerization initiator, a polymer binder, and a sensitizing dye having an absorption maximum in the wavelength regions of from 390 to 430 nm, the minimum laser exposure amount necessary to form an image on the material being from 1.0 to 100 $\mu J/cm^2$, the method comprising the step of imagewise exposing the light sensitive planographic printing plate material to laser under a non-yellow safelight to form an image, the non-yellow safelight having an optical filter cutting out light with a wavelength of less than 440 nm, and satisfying the following expression:

$$0.800 \leq I/I_{700} < 1.00$$

wherein $I_{700}$ represents a transmittance of light with a wavelength of 700 nm, and I represents a transmittance of light with a wavelength of from 440 to less than 700 nm.

1-2. The method of item 1-1 above, wherein the photopolymerization initiator is a monoalkyltriarylborate compound.

1-3. The method of item 1-1 above, wherein the photopolymerization initiator is an iron arene complex.

1-4. The method of any one of items 1-1 through 1-3 above, wherein the photopolymerization initiator is a bromine-containing compound represented by formula 1 or 2 above.

1-5. The method of any one of items 1-1 through 1-4 above, wherein an addition polymerizable ethylenically unsaturated monomer has a tertiary amino group in the molecule.

1-6. The method of item 1-5 above, wherein an addition polymerizable ethylenically unsaturated monomer is a reaction product of a polyhydric alcohol having a tertiary amino group in the molecule, a diisocyanate compound and a compound having in the molecule a hydroxyl group and an addition polymerizable ethylenically double bond.

1-7. The method of any one of items 1-1 through 1-6 above, wherein the sensitizing dye having an absorption maximum in the wavelength regions of from 390 to 430 nm is a dye having a difluoro(2-acylphenoxy)borane structure.

1-8. The method of any one of items 1-1 through 1-7 above, wherein the light sensitive planographic printing plate material has an overcoat layer containing a dyestuff on the light sensitive layer, the overcoat layer having a wavelength providing an absorption maximum in the wavelength regions exceeding 420 nm, and being transparent to laser used in the imagewise exposure.

The invention will be further detailed below.

The present invention is a method of forming an image on a light sensitive planographic printing plate material comprising a hydrophilic support and provided thereon, a light sensitive layer containing an addition polymerizable ethylenically unsaturated monomer, a photopolymerization initiator, a polymer binder, and a dye having an absorption maximum in the wavelength regions of from 390 to 430 nm, the minimum laser exposure amount necessary to form an image on the material being from 1.0 to 100 $\mu J/cm^2$, the method comprising the step of imagewise exposing the light sensitive planographic printing plate material to laser under a non-yellow safelight to form an image, the non-yellow safelight having an optical filter cutting out light with a wavelength of less than 440 nm, and satisfying the following expression:

$$0.800 \leqq I/I_{700} < 1.00$$

wherein $I_{700}$ represents a transmittance of light with a wavelength of 700 nm, and I represents a transmittance of light with a wavelength of from 440 nm to less than 700 nm.

The light sensitive planographic printing plate material in the invention is preferably exposed employing a laser emitting light with ultraviolet wavelength regions, particularly a blue-violet semi-conductor laser stably emitting light with a wavelength of from 390 to 430 nm, and preferably 400 to 420 nm. Herein, it is necessary that the minimum exposure amount necessary to form an image be not more than 100 $\mu J/cm^2$ in order to shorten time for image writing. The minimum exposure amount is preferably not more than 50 $\mu J/cm^2$, and more preferably not more than 35 $\mu J/cm^2$. The lower limit of the minimum exposure amount is preferably less, but the lower limit is 1 0 $\mu J/cm^2$, and practically 2.5 $\mu J/cm^2$.

The non-yellow safelight used in the invention has a filter cutting out light with a wavelength of not more than 440 nm, and satisfying the expression $0.800 \leqq I/I_{700} < 1.00$ wherein $I_{700}$ represents a transmittance of light with a wavelength of 700 nm, and I represents a transmittance of light with a wavelength of from more than 440 nm to less than 700 nm. An ordinary yellow safelight is adjusted to cut out light with a wavelength of not more than 520 nm, and a white safelight to cut out light with a wavelength of not more than 400 nm. The safelight adjusted to cut out only the light with a wavelength of not more than 440 nm emits a light-yellow light. Accordingly, the safelight in the invention is adjusted to cut out the light with a wavelength of not more than 440 nm and at the same time to satisfy the expression $0.800 \leqq I/I_{700} < 1.00$ as described above, whereby a safelight close to white light can be realized. Such a safelight can be obtained by mounting a filter satisfying the conditions described above on a fluorescent lamp available on the market. As such a filter, there is, for example, a non-yellow type UV cut acryl filter produced by Annaka Tokushugarasu Seisakusho Co., Ltd.

The luminosity is preferably from 20 to 40 lux considering workability and fog resistance of a light sensitive planographic printing plate material. Time during which the light sensitive planographic printing plate material is handled under safelight, that is, the material is exposed and developed under safelight, is considered to be ordinarily about 5 minutes, including also time during which the material is taken out of the package, a plate setter is loaded in a cassette, and the material is loaded in the plate setter. However, it is desirable that the light sensitive planographic printing plate material produces no problem even when it is allowed to stand for 40 minutes under safelight, since unexpected troubles may occur during handling. That "the light sensitive planographic printing plate material produces no problem" herein referred to means that when under safelight, the light sensitive planographic printing plate material is handled, exposed, developed and subjected to inking treatment with development ink, the development ink is not deposited on the non-image portions.

As a photopolymerization initiator in the invention, monoalkyltriaryl borate compounds, or iron arene complexes are preferably used.

As the monoalkyltriaryl borate compounds, there are those described in Japanese Patent O.P.I. Publication Nos. 62-150242 and 62-143044. Preferred examples of the monoalkyltriaryl borate compounds include tetra-n-butyl ammonium n-butyl-trinaphthalene-1-yl-borate, tetra-n-butyl ammonium n-butyl-triphenyl-borate, tetra-n-butyl ammonium n-butyl-tri-(4-tert-butylphenyl)-borate, tetra-n-butyl ammonium n-hexyl-tri-(3-chloro-4-methylphenyl)-borate, and tetra-n-butyl ammonium n-hexyl-tri-(3-fluorophenyl)-borate.

As the iron arene complexes, there are those described in Japanese Patent O.P.I. Publication No. 59-219307. Preferred examples of the iron arene complex include η-benzene-(η-cyclopentadienyl)iron.hexafluorophosphate, η-cumene)-(η-cyclopentadienyl)iron.hexafluorophosphate, η-fluorene-(η-cyclopentadienyl)iron.hexafluorophosphate, η-naphthalene-(η-cyclopentadienyl)iron.hexafluorophosphate, η-xylene-(η-cyclopentadienyl)iron.hexafluorophosphate, and η-benzene-(η-cyclopentadienyl)iron.hexafluoroborate.

Another photopolymerization initiator can be used in combination. Examples thereof include carbonyl compounds, organic sulfur compounds, peroxides, redox compounds, azo or diazo compounds, halides and photo-reducing dyes disclosed in J. Kosar, "Light Sensitive Systems", Paragraph 5, and those disclosed in British Patent No.

1,459,563. Typical examples of the photopolymerization initiator used in combination include the following compounds:

A benzoin derivative such as benzoin methyl ether, benzoin i-propyl ether, or α,α-dimethoxy-α-phenylacetophenone; a benzophenone derivative such as benzophenone, 2,4-dichlorobenzophenone, o-benzoyl methyl benzoate, or 4,4'-bis (dimethylamino) benzophenone; a thioxanthone derivative such as 2-chlorothioxanthone, 2-i-propylthioxanthone; an anthraquinone derivative such as 2-chloroanthraquinone or 2-methylanthraquinone; an acridone derivative such as N-methylacridone or N-butylacridone; α,α-diethoxyacetophenone; benzil; fluorenone; xanthone; an uranyl compound; a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85–277 (1988) and Japanese Patent O.P.I. Publication No. 2-182701; 2,4,5-triarylimidazol dimmer disclosed in Japanese Patent O.P.I. Publication No. 3-209477; carbon tetrabromide; organic halide compounds disclosed in Japanese Patent O.P.I. Publication No. 59-107344.

The planographic printing plate material preferably contains at least one bromine-containing compound selected from the compounds represented by formula (1) or (2), which provides high printing durability as well as high sensitivity.

Typical examples of the bromine-containing compound represented by formula (1) will be listed below (BR 1 through BR 66), but are not limited thereto. Typical examples of the bromine-containing compound represented by formula (2) will be also listed below (BR 2 through BR 47).

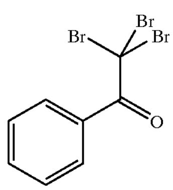

BR1

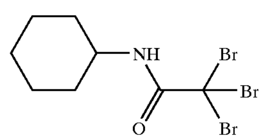

BR2

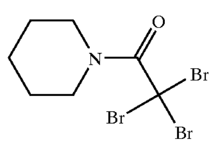

BR3

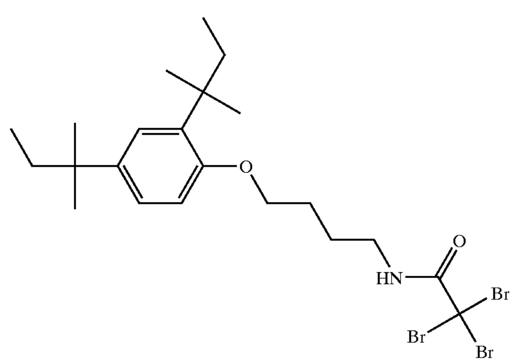

BR4

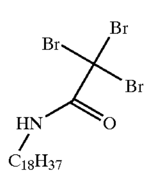

BR5

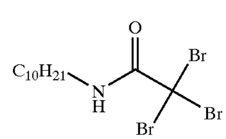

BR6

-continued
BR7
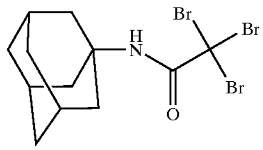
BR8
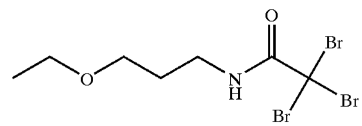
BR9
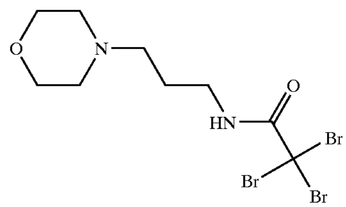
BR10
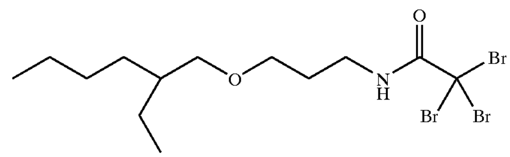
BR11
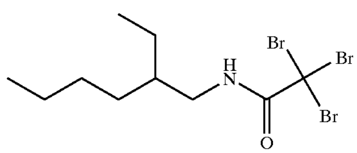
BR12
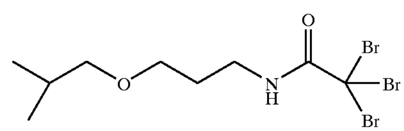
BR13
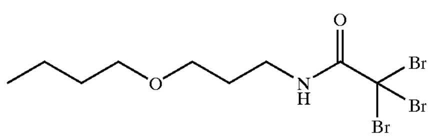
BR14
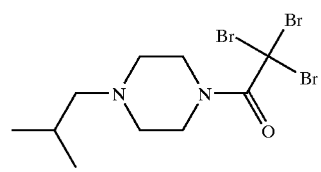
BR15
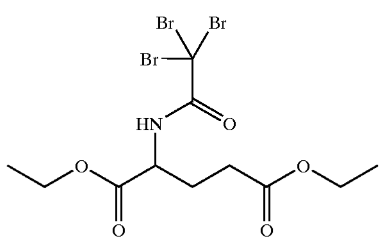
BR16
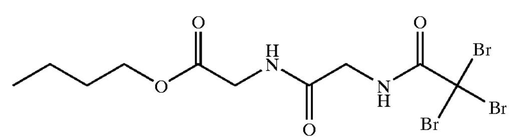
BR17
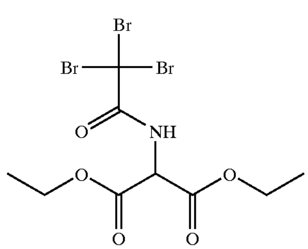
BR18
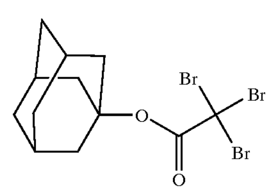
BR19
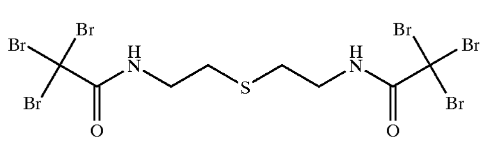
BR20
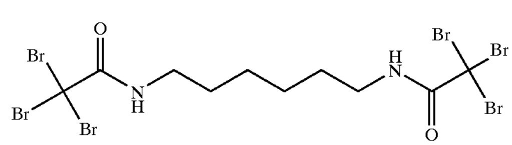

-continued
BR21
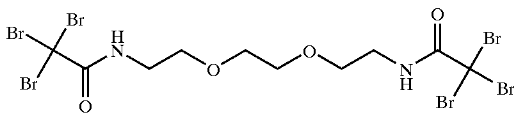
BR22
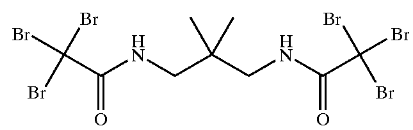
BR23
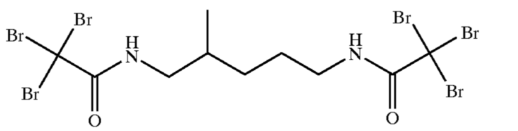
BR24
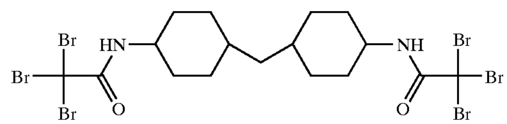
BR25
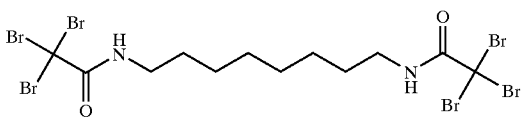
BR26
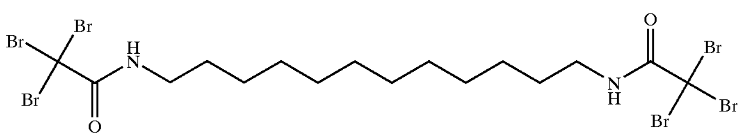
BR27
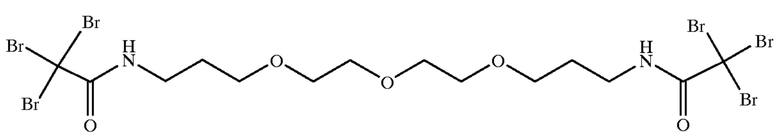
BR28
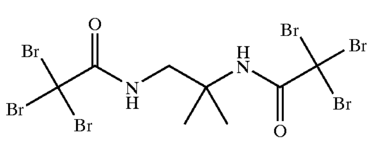
BR29
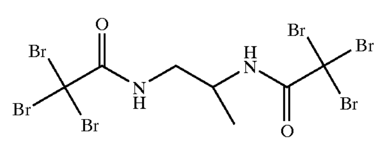
BR30
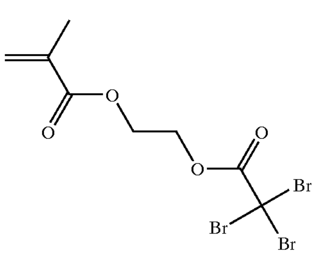
BR31
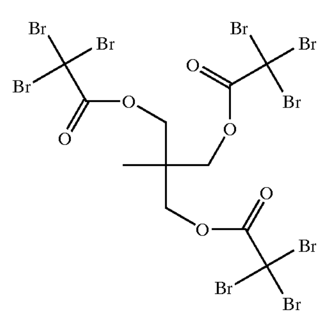

-continued
BR32
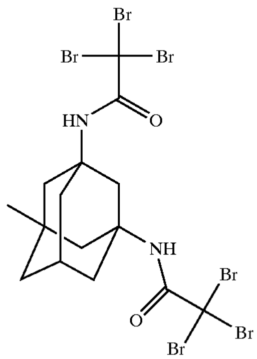
BR33
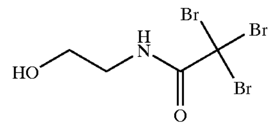
BR34
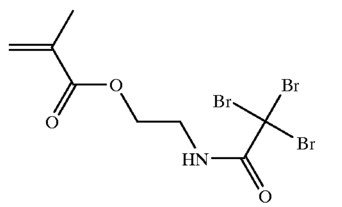
BR35
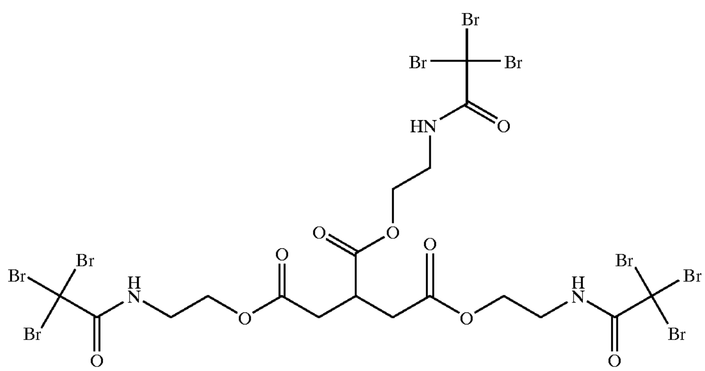
BR36
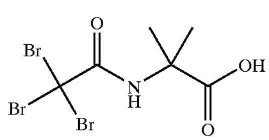
BR37
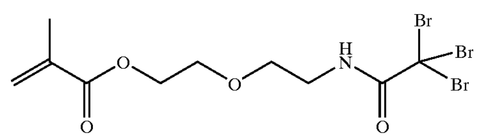
BR38
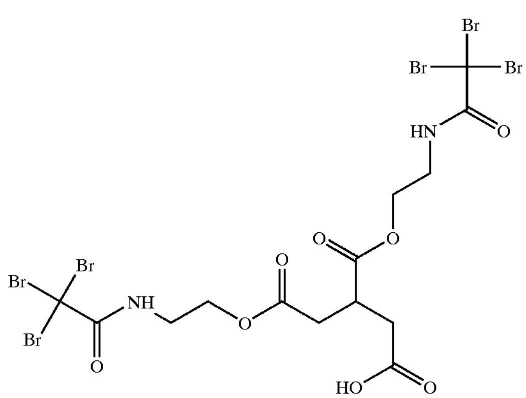

-continued
BR39
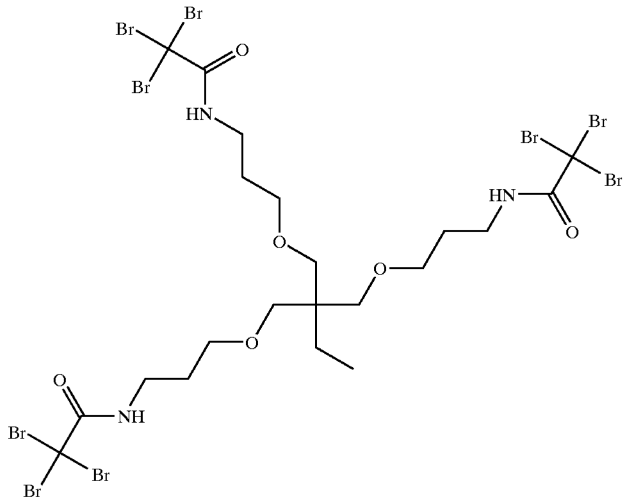
BR40
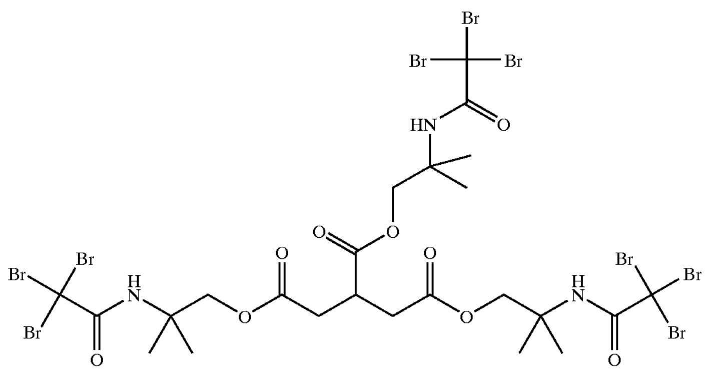
BR41
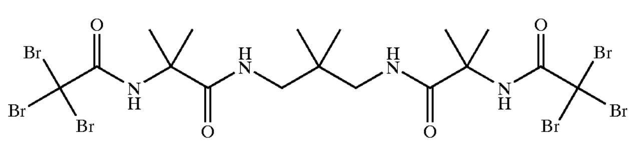
BR42
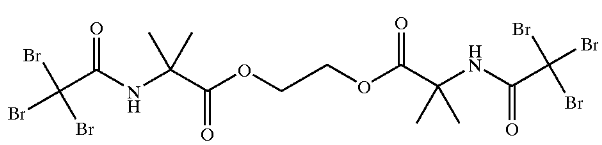

-continued
BR43
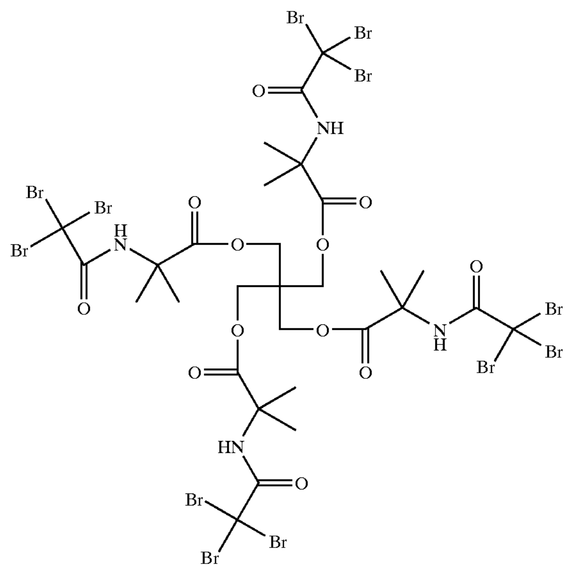
BR44
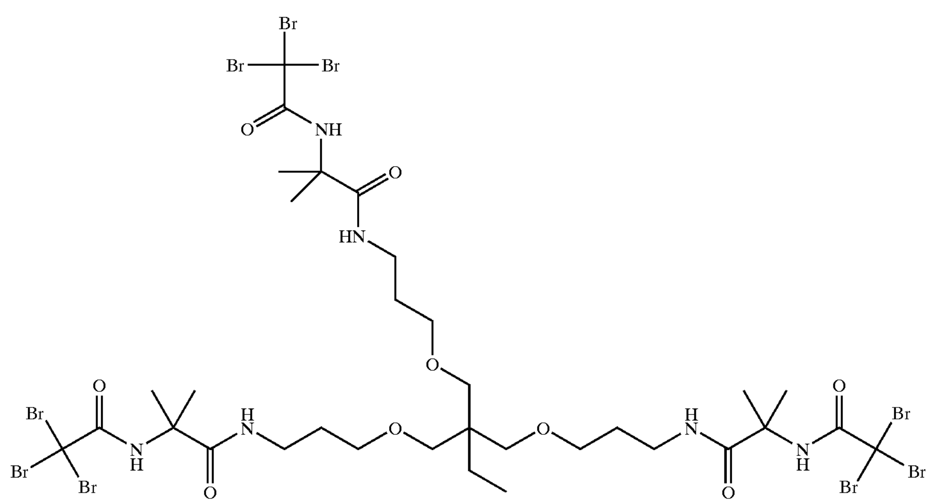
BR45
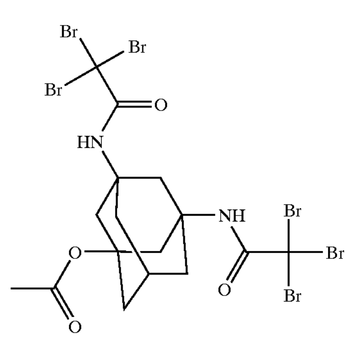
BR46
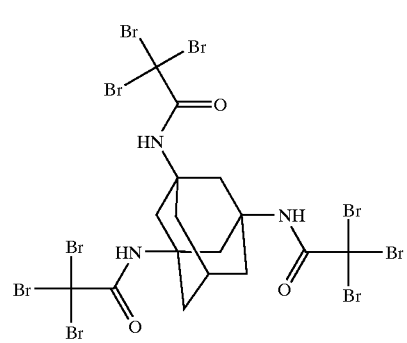
BR47
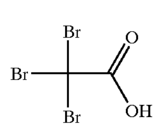
BR48
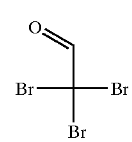

-continued
BR49
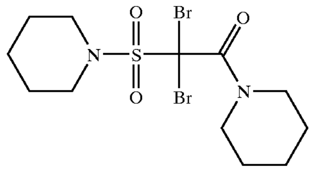
BR50
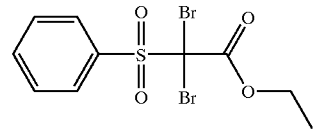
BR51
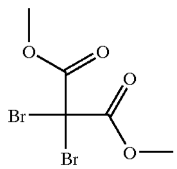
BR52
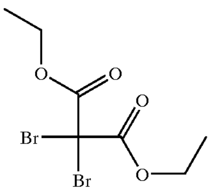
BR53
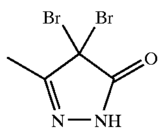
BR54
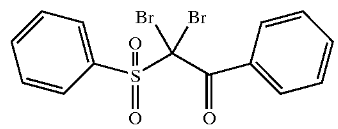
BR55
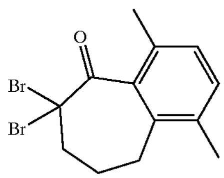
BR56
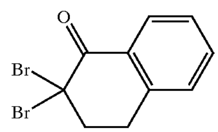
BR57
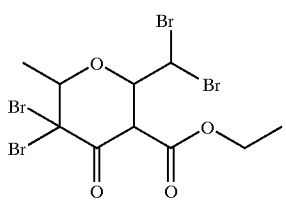
BR58
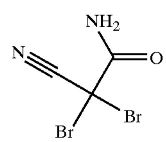
BR59
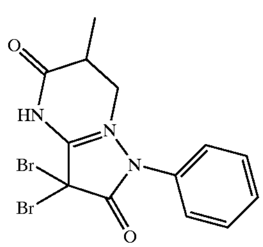
BR60
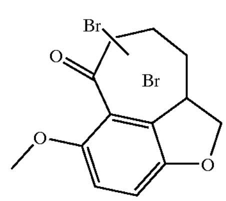
BR61
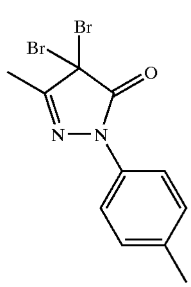
BR62
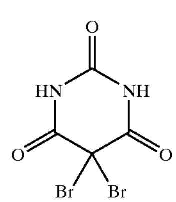

-continued

BR63

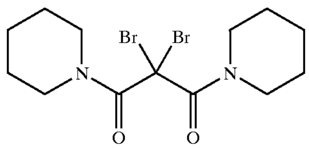

BR64

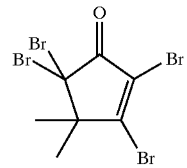

BR65

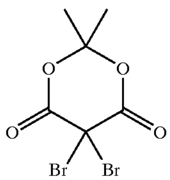

BR66

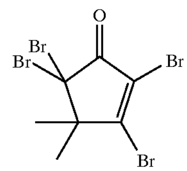

In the invention, the light sensitive planographic printing plate material comprises, as a sensitizing dye, a dye having an absorption maximum in the wavelength regions of from 390 to 430 nm. Examples of such a dye include a cumarin compound, a cyanine compound, a merocyanine compound, a difluoro(2-acylphenoxy)borane compound, a barbituric acid compound, a styryl compound, an azo compound, an acridine compound, a porphyrin compound, and a pyran compound. Among these, a difluoro(2-acylphenoxy)borane compound is preferred, and a difluoro(2-acylphenoxy)borane compound represented by formula 3 below is more preferred.

Formula 3

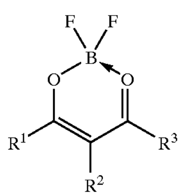

In formula 3 above, $R^1$, $R^2$, and $R^3$ independently represent a hydrogen atom or a substituent group, provided that $R^1$ and $R^2$ combine with each other to form a ring or $R^2$ and $R^3$ combine with each other to form a ring.

A compound represented by formula 4 is especially preferred.

Formula 4

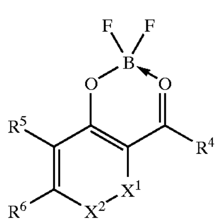

In formula 4 above, $R^4$ represents a hydrogen atom, an alkyl group which may have a substituent, an alkenyl group which may have a substituent, an aryl group which may have a substituent, or a heterocyclic group which may have a substituent; $R^5$ and $R^6$ represent a substituent capable of combining with each other to form a ring; and $X^1$ and $X^2$ independently represent —$CR^7R^8$—, —O—, —S—, or —$NR^9$—, in which $R^7$, $R^8$, and $R^9$ independently represent a hydrogen atom, an alkyl group which may have a substituent, an alkenyl group which may have a substituent, an aryl group which may have a substituent, or a heterocyclic group which may have a substituent.

Examples of the spectral sensitizing dye represented by formula 3 or 4 are listed below, but are not limited thereto.

C-1

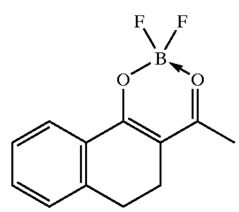

C-2

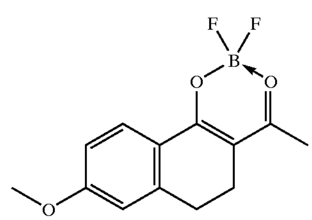

C-3

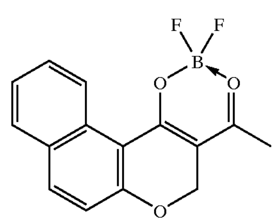

C-4

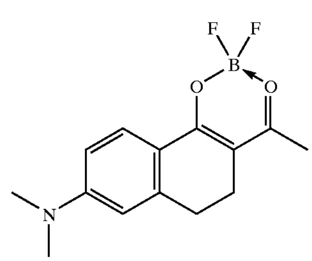

-continued

C-5

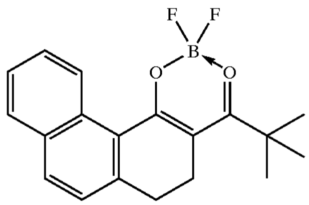

C-6

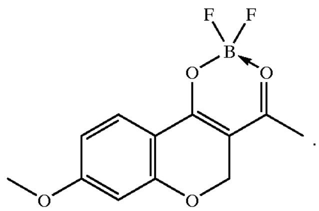

The content of the photopolymerization initiator described above in the light sensitive layer is not specifically limited, but is preferably from 0.1 to 20 parts by weight based on 100 parts by weight of the addition polymerizable monomer in the light sensitive layer. The content ratio by mole of the photopolymerization initiator to the sensitizing dye is preferably from 1:100 to 100:1.

As the addition polymerizable ethylenically unsaturated monomer in the invention, there are a known monomer such as a radical polymerizable monomer, and a polyfunctional monomer or oligomer having two or more of an ethylenic double bond in the molecule generally used in an ultraviolet curable resin composition. The monomers are not specifically limited.

Preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ϵ-caprolactone adduct with acrylic acid, or 1,3-dioxolane acrylate; a methacrylate, itaconate, crotonate or maleate alternative of the above acrylate; a bifunctional acrylate such as ethyleneglycol diacrylate, triethyleneglycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ϵ-caprolactone adduct, 2-(2-hydroxy-1,1-dimethylethyl)- 5-hydroxymethyl-5-ethyl-1,3-dioxane diacrylate, tricyclodecanedimethylol acrylate, tricyclodecanedimethylol acrylate-ϵ-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ϵ-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

A prepolymer can be used, and examples of the prepolymer include compounds as described later. The prepolymer with a photopolymerizable property, which is obtained by incorporating acrylic acid or methacrylic in an oligomer with an appropriate molecular weight, can be suitably employed. This prepolymer can be used singly, as an admixture of the above described monomers and/or oligomers.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A.epichlorhydrin.(meth)acrylic acid or phenol novolak.epichlorhydrin.(meth)acrylic acid obtained by incorporating (meth)acrylic acid in an epoxy resin; an urethane-acrylate such as ethylene glycol.adipic acid.tolylenediisocyanate.2-hydroxyethylacrylate, polyethylene glycol.tolylenediisocyanate.2-hydroxyethylacrylate, hydroxyethylphthalyl methacrylate.xylenediisocyanate, 1,2-polybutadieneglycol.tolylenediisocyanate.2-hydroxyethylacrylate or trimethylolpropane.propylene glycol.tolylenediisocyanate.2-hydroxyethylacrylate, obtained by incorporating (meth)acrylic acid in an urethane resin; a silicone acrylate such as polysiloxane acrylate, or polysiloxane.diisocyanate.2-hydroxyethylacrylate; an alkyd modified acrylate obtained by incorporating a methacroyl group in an oil modified alkyd resin; and a spiran resin acrylate.

The light sensitive composition of the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition polymerizable oligomer or prepolymer having a structural unit derived from the above monomer.

The ethylenic monomer used in the invention is preferably a phosphate compound having at least one (meth) acryloyl group. The phosphate compound is a compound having a (meth)acryloyl group in which at least one hydroxyl group of phosphoric acid is esterified, and the phosphate compound is not limited as long as it has a (meth)acryloyl group.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV-EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

In the invention, an addition polymerizable ethylenically unsaturated monomer having a tertiary amino group in the molecule is preferably used. Its molecular structure is not limited, but those are preferred in which a tertiary amine having a hydroxyl group is modified with glycidyl methacrylate, methacrylic chloride, or acrylic chloride. Examples thereof include a polymerizable compound disclosed I Japanese Patent O.P.I. Publication Nos. 1-165613, 1-203413 and 1-197213.

A reaction product of a polyhydric alcohol having a tertiary amino group in the molecule, a diisocyanate and a compound having a hydroxyl group and an addition polymerizable ethylenically double bond in the molecule is preferably used in the invention. can be synthesized according to the same method as a conventional method in which a urethaneacrylate compound is ordinarily synthesized employing a diol, a diisocyanate and an acrylate having a hydroxyl group.

Examples of the polyhydric alcohol having a tertiary amino group in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N,N',N'-tetra-2-hydroxypropylethylenediamine, p-tolyldiethanolamine, N,N,N',N'-tetra-2-hydroxyethylethylenediamine, N,N-bis (2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol, but the invention is not specifically limited thereto.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto. Examples of the compound having a hydroxyl group and an addition polymerizable ethylenically double bond in the molecule include the following compounds MH-1 through MH-13, but the invention is not specifically limited thereto.

MH-1

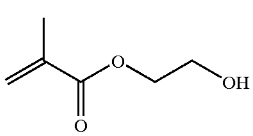

MH-2

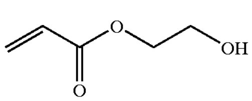

MH-3

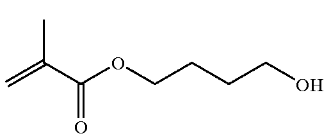

MH-4

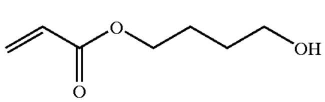

-continued

MH-5

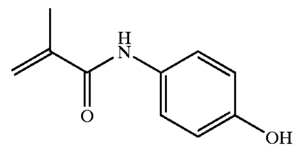

MH-6

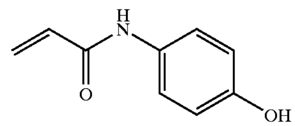

MH-7

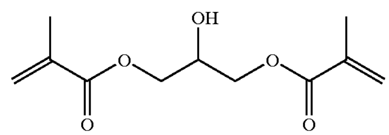

MH-8

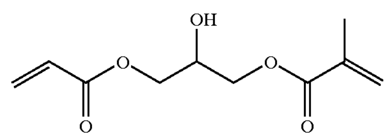

MH-9

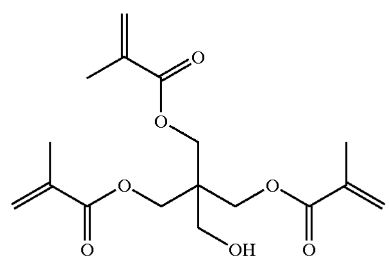

MH-10

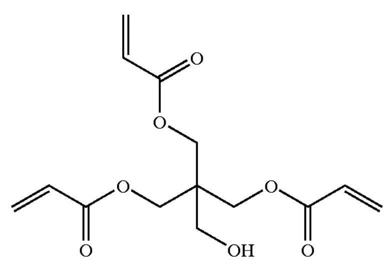

MH-11

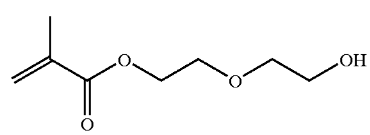

MH-12

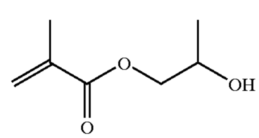

MH-13

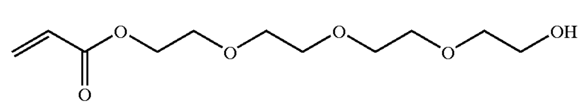

Preferred examples thereof include 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

The reaction product above can be synthesized according to the same method as a conventional method in which a urethaneacrylate compound is ordinarily synthesized employing an ordinary diol, a diisocyanate and an acrylate having a hydroxyl group.

Examples of the reaction product of a polyhydric alcohol having a tertiary amino group in the molecule, a diisocyanate and a compound having a hydroxyl group and an addition polymerizable ethylenically double bond in the molecule will be listed below.

M-1: A reaction product of triethanolamine (1 mole), hexane-1,6-diisocyanate (3 moles), and 2-hydroxyethyl methacrylate (3 moles)

M-2: A reaction product of triethanolamine (1 mole), isophorone diisocyanate (3 moles), and 2-hydroxyethyl methacrylate (3 moles)

M-3: A reaction product of N-n-butyldiethanolamine (1 mole), 1,3-bis(1-cyanato-1-methylethyl)benzene (2 moles), and 2-hydroxypropylene-1-methacrylate-3-acrylate (2 moles)

M-4: A reaction product of N-n-butyldiethanolamine (1 mole), 1,3-di(cyanatomethyl)benzene (2 moles), and 2-hydroxypropylene-1-methacrylate-3-acrylate (2 moles)

M-5: A reaction product of N-methydiethanolamine (1 mole), tolylene-2,4-diisocyanate (2 moles), and 2-hydroxypropylene-1,3-dimethacrylate (2 moles)

In addition to the above, acrylates or methacrylates disclosed in Japanese Patent O.P.I. Publication Nos. 2-105238 and 1-127404 can be used.

The light sensitive planographic printing plate material in the invention comprises a photopolymerizable light sensitive layer containing a polymer binder.

As the polymer binder can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof.

The polymer binder used in the invention is preferably a vinyl copolymer obtained by copolymerization of an acryl monomer, and more preferably a copolymer containing (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another monomer unit, a monomer unit derived from the monomer described in the following items (1) through (14):

(1) A monomer having an aromatic hydroxy group, for example, o-, (p- or m-) hydroxystyrene, or o-, (p- or m-) hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl) methacrylamide, or N-(p-aminosulfonylphenyl)acrylamide;

(4) A monomer having a sulfonamido group, for example, N-(p-toluenesulfonyl)acrylamide, or N-(p-toluenesulfonyl)-methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenyl-methacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl) heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chroloacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further another monomer may be copolymerized with the above monomer. As the polymer binder is also preferred an unsaturated bond-containing copolymer which is obtained by reacting a carboxyl group contained in the above vinyl copolymer molecule with for example, a compound having a (meth)acryloyl group and an epoxy group. Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

The weight average molecular weight of the above copolymer is preferably 10,000 to 200,000 measured by gel permeation chromatography (GPC), but is not limited thereto.

The content of the polymer binder in the light sensitive composition is preferably from 10 to 90% by weight, more preferably from 15 to 70% by weight, and still more preferably from 20 to 50% by weight, in view of sensitivity.

The acid value of the polymer binder is preferably from 10 to 150, more preferably from 30 to 120, and still more preferably from 50 to 90, in view of balance of polarity of the photopolymerizable light sensitive layer, which can prevent coagulation of pigment used in the photopolymerizable light sensitive layer coating liquid.

In the invention, it is preferred that the light sensitive planographic printing plate material comprises an overcoat layer containing a dyestuff, which is provided on the light sensitive layer. The overcoat layer has an absorption maximum in the wavelength regions exceeding 420 nm, and is transparent to light used for forming an image. It is preferred that the overcoat layer further contains a polymer binder.

Examples of the polymer binder include polyvinyl alcohol, polysaccharide, polyvinyl pyrrolidone, polyethylene glycol, gelatin, glue, casein, hydroxyethyl cellulose, carboxymethyl cellulose, methylcellulose, hydroxyethyl starch, gum arabic, sucrose octacetate, ammonium alginate, sodium alginate, polyvinyl amine, polyethylene oxide, polystyrene sulfonic acid, polyacrylic acid, or a water soluble polyamide. These binders can be used alone or as a mixture of two or more kinds thereof. Polyvinyl alcohol is especially preferred.

A coating solution for the overcoat layer is prepared by dissolving the overcoat layer composition described above in an appropriate solvent (described later). The coating solution is coated on the light sensitive layer side of the support to be located farther from the support than the light sensitive layer, and dried to form the overcoat layer.

The thickness of the overcoat layer is preferably from 0.1 to 5.0 μm, and more preferably from 0.5 to 3.0 μm. The overcoat layer can contain an additive such as a surfactant or a matting agent.

Coating of the overcoat layer can be suitably carried out according to the known coating method described above. The drying temperature of the overcoat layer coating is preferably lower than that in the photopolymerizable light sensitive layer coating. The difference between drying temperature in the overcoat layer coating and that in the photopolymerizable light sensitive layer coating is more preferably not less than 10° C., and still more preferably not less than 20 ° C. Herein, the upper limit of the difference is preferably at most around 50 ° C.

The drying temperature of the overcoat layer is preferably lower than the glass transition point (Tg) of the polymer binder contained in the photopolymerizable light sensitive layer.

The difference between drying temperature of the overcoat layer coating and the glass transition point (Tg) of the polymer binder of the photopolymerizable light sensitive layer is preferably not less than 20° C., and more preferably not less than 40° C. Herein, the upper limit of the difference is preferably at most around 60 ° C.

The overcoat layer has an absorption maximum in the wavelength regions exceeding 420 nm. In order to obtain the overcoat layer having an absorption maximum in the wavelength regions exceeding 420 nm, it is preferred that a dyestuff such as a dye or pigment is added to the overcoat layer. The overcoat layer has, in the wavelength regions exceeding 420 nm, an absorption intensity of preferably not less than 1.0, and more preferably not less than 2.0. The wavelength providing the absorption maximum in the overcoat layer is in the wavelength regions exceeding 420 nm, and the upper limit of the regions is not specifically limited, however, the upper limit is approximately 900 nm, since it is economically and technically practicable.

The overcoat layer is transparent to light used for image writing. That the overcoat layer is transparent to light used for image writing means that the absorption intensity of the overcoat layer is not more than 0.5 to the light. The dyestuff to be added to such a layer, which has an absorption maximum in the wavelength regions exceeding 420 nm, is preferably a red dye or red pigment, and more preferably a water soluble red dye. Examples of the dyestuff include oxonol red 536N (produced by PINA Co., Ltd.).

As a method for measuring an absorption intensity of the overcoat layer having an absorption maximum in the wavelength regions exceeding 420 nm, there is a method in which a layer to be measured is coated on a 100 μm thick PET film which transmits a visible light to prepare a sample, and transmission spectra from 400 to 700 nm of the sample are measured through a spectrophotometer. However, the method may be one in which the layer to be measured is directly measured without forming the layer by coating on the PET film, if it is possible. In the former method, the reference sample is an uncoated 100 μm thick PET film.

The solvents used in the preparation of a coating liquid for the light sensitive layer in the invention or another layer include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone or aldehyde such as diacetone alcohol, cyclohexanone, or methyl cyclohexanone; and an ester such as ethyl lactate, butyl lactate, diethyl oxalate, or methyl benzoate.

The prepared coating liquid for the photopolymerizable light sensitive layer is coated on a support according to a conventional method, and dried to obtain a light sensitive planographic printing plate precursor. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

A low drying temperature of the coated light sensitive layer cannot provide sufficient printing durability, while too a high drying temperature of the coated light sensitive layer results in marangoni and produces fog at non-image portions. The drying temperature is preferably from 60 to 160° C., more preferably from 80 to 140° C., and still more preferably from 90 to 120° C. The drying temperature described above also applies to layers other than the photopolymerizable light sensitive layer.

EXAMPLES

Next, synthetic examples, manufacturing examples of support, and examples will be shown below, but the present invention is not limited thereto. In the examples, "parts" represents "parts by weight", unless otherwise specified.

Example 1

Synthesis of Polymer Binder

Synthesis of Acryl Copolymer 1

Thirty parts of methacrylic acid, 50 parts of methyl methacrylate, 20 parts of ethyl methacrylate, 500 parts of isopropyl alcohol, and 3 parts of α,α'-azobisisobutyronitrile were put in a three neck flask under nitrogen atmosphere, and reacted under nitrogen atmosphere for 6 hours at 80° C. in an oil bath. After that, the reaction mixture was refluxed at a boiling point of isopropyl alcohol for one hour, and 3 parts of triethylammonium chloride and 25 parts of glycidyl methacrylate were further added to the mixture, and reacted for additional 3 hours. Thus, acryl copolymer 1 was obtained. The weight average molecular weight of the acryl copolymer 1 was 35,000, measured according to GPC. The glass transition temperature Tg of the acryl copolymer 1 was 85° C., measured according to DSC (differential thermal analysis).

Preparation of Support

A 0.3 mm thick aluminum plate (material 1050, quality H16) was degreased at 60° C. for one minute in a 5% sodium hydroxide solution, washed with water, immersed at 25° C. for one minute in a 10% hydrochloric acid solution to neutralize, and then washed with water. The resulting aluminum plate was electrolytically etched using an alternating current at 25° C. for 60 seconds at a current density of 100 A/dm$^2$ in a 0.3 weight % nitric acid solution, and desmutted at 60° C. for 10 seconds in a 5% sodium hydroxide solution. The desmutted aluminum plate was anodized at 25° C. for 1 minute at a current density of 10 A/dm$^2$ and at a voltage of 15 V in a 15% sulfuric acid solution, and subjected to hydrophilic treatment at 75° C., employing a 1% polyvinyl phosphonic acid aqueous solution. Thus, support was obtained. The center line average surface roughness (Ra) of the support was 0.65 μm.

Preparation of Light Sensitive Planographic Printing Plate Material

The following photopolymerizable light sensitive layer coating solution 1 was coated on the resulting support through a wire bar, and dried at 95° C. for 1.5 minutes to give a light sensitive layer having a dry thickness of 1.5 g/m$^2$.

Photopolymerizable Light Sensitive Layer Coating Solution

| | |
|---|---|
| M-3 (addition polymerizable ethylenically unsaturated monomer) | 25.0 parts |
| NK ester 4G (polyethylene glycol dimethacrylate, produced by Shin Nakamura Kagaku Co., Ltd.) | 15.0 parts |
| Photopolymerization initiator (as shown in Table 1) | amount shown in Table 1 |
| Spectral sensitizing dye (as shown in Table 1) | amount shown in Table 1 |
| Acryl copolymer 1 | 40.0 parts |
| N-Phenylglycine benzyl ester | 4.0 parts |
| Phthalocyanine pigment (MHI 454 produced by Mikuni Sikisosha) | 6.0 parts |
| 2-t-Butyl-6-(3-t-butyl-2-hydroxy-5-methylbenzyl)-4-methylphenyl acrylate (Sumirizer GS produced by Sumitomo 3M Co., Ltd.) | 0.5 parts |
| Fluorine-contained surfactant (FC-178K produced by Dainippon ink Kagaku Kogyo Co., Ltd.) | 0.5 parts |
| Methyl ethyl ketone | 80 parts |

Cyclopentanone was added to make a solution of 1000 parts.

After that, the following oxygen shielding layer coating solution 1 was coated on the photopolymerizable light sensitive layer using an applicator, and dried at 75° C. for 1.5 minutes to give an oxygen shielding layer with a dry thickness of 1.8 g/m$^2$. Thus, light sensitive planographic printing plate material samples 1 through 4 were prepared.

Oxygen Shielding Layer Coating Solution 1

| | |
|---|---|
| Polyvinyl alcohol (GL-05, produced by Nippon Gosei Kagaku Co., Ltd.) | 89 parts |
| Water soluble polyamide (P-70, produced by Toray Co., Ltd.) | 10 parts |
| Surfactant (Surfinol 465, produced by Nisshin Kagaku Kogyo Co., Ltd.) | 0.5 parts |
| Water | 900 parts |

Evaluation of light sensitive planographic printing plate material sample

Measurement of Sensitivity

The light sensitive planographic printing plate material sample obtained above was imagewise exposed at a resolving degree of 2400 dpi, employing a modified plate setter Tiger Cat (produced by ECRM Co., Ltd.) equipped with a 30 mW laser emitting a 408 nm laser beam. Herein, dpi represents the dot numbers per 2.54 cm. The image pattern used for the exposure comprised a solid image and a square dot image with a screen number of 175 LPI and a 50% dot area. Subsequently, the exposed sample was subjected to development treatment employing a CTP automatic developing machine (PHW 23-V produced by Technigraph Co., Ltd.) to obtain a planographic printing plate. Herein, the developing machine comprised a preheating section for preheating the exposed sample at 105° C. for 10 seconds, a pre-washing section for removing the oxygen shielding layer before development, a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Thus, a planographic printing plate was obtained. The lowest exposure energy amount (μJ/cm$^2$) reproducing the solid image above in the resulting planographic printing plate with no reduction of the layer thickness at the solid image portions was defined as sensitivity. The less the lowest exposure energy amount (μJ/cm$^2$) is, the higher the sensitivity. The results are shown in Table 1.

<Developer Composition>

| | |
|---|---|
| Potassium silicate A (an aqueous potassium silicate solution containing 25.5–27.5% by weight of $SiO_2$ and 12.5–14.5% by weight of $K_2O$) | 8.0% by weight |
| NEW COL B-13SN produced by Nippon Nyukazai Co., Ltd. | 3.0% by weight |
| Potassium hydroxide | Amount giving pH 12.3 |

(Safelight Property)

Condition A

A non-yellow type acryl UV cut filter produced by Annaka Tokushugarasu Seisakusho Co., Ltd. was provided on a 36 W white fluorescent lamp Neo Lumisuper FLR-40SW/M/36-B produced by Mitsubishi Denki Co., Ltd. to prepare a room light. After that, the sample was exposed to an illuminance of 350 lux under the room light for 5, 10, 15, 20, 25, 30, 35, 40, 45, 50, 55, and 60 minutes at an interval of 5 minutes. The resulting sample was developed in the same manner as in the evaluation of sensitivity above. The developed sample was inked employing developing ink PI2 produced by Fuji Photo Film Co., Ltd., and it was observed whether or not stain (inking) stain at non-image portions. The longest exposed time producing no stain at non-image portions in each sample was defined as the safelight time of the sample, and evaluated as a measure of a safelight property. The longer the safelight time, the better the safelight property.

Condition B

A 36 W white fluorescent lamp Neo Lumisuper FLR-40SW/M/36-B produced by Mitsubishi Denki Co., Ltd. was used as a room light without any filter provided. After that, the sample was exposed to an illuminance of 350 lux under the room light for 5, 10, 15, 20, 25, 30, 35, 40, 45, 50, 55, and 60 minutes at an interval of 5 minutes. The resulting sample was processed and evaluated in the same manner as in condition A above. The results are shown in Table 1.

TABLE 1

| Sample No. | Photopolymerization initiator used (parts) | Spectral sensitizing dye used (parts) | Sensitivity ($\mu$J/cm$^2$) | Safelight condition | Safelight time (min.) | Remarks |
|---|---|---|---|---|---|---|
| 1 | B-1 (4.0) | C-2 (2.0) | 60 | A | | Inv. |
| 2 | B-1 (4.0), BR22 (3.0) | C-2 (2.0) | 50 | A | | Inv. |
| 3 | R-1 (4.0) | C-2 (2.0) | 35 | A | | Inv. |
| 4 | R-1 (4.0), BR22 (3.0) | C-2 (2.0) | 10 | A | | Inv. |
| 1 | B-1 (4.0) | C-2 (2.0) | 60 | B | 5 | Comp. |
| 2 | B-1 (4.0), BR22 (3.0) | C-2 (2.0) | 50 | B | 3 | Comp. |
| 3 | R-1 (4.0) | C-2 (2.0) | 35 | B | 2 | Comp. |
| 4 | R-1 (4.0), BR22 (3.0) | C-2 (2.0) | 10 | B | 1 | Comp. |

Inv. Inventive.
Comp.: Comparative
B-1: tetra-n-butylammoniumn-butyltrinaphthalene-1-yl-borate
R-1: η-cumene-(η-cyclopentadienyl)iron·hexafluoroborate As is apparent from Table 1 above, when the sample is handled under the non-yellow safelight in the invention, which is close to white light and which provides working environment under which the sample is easy to handle, the safelight property is greatly improved.

Example 2

A photopolymerizable light sensitive layer was coated on the support in the same manner as in Example 1, except that M-3 as the addition polymerizable ethylenically unsaturated monomer was replaced with M-5, and the photopolymerization initiator and spectral sensitizing dye were replaced with those shown in Table 2. Then, the following oxygen shielding layer coating solution 1 was coated on the photopolymerizable light sensitive layer using an applicator, and dried at 75° C. for 1.5 minutes to give an oxygen shielding layer with a dry thickness of 1.8 g/m$^2$.

Oxygen Shielding Layer Coating Solution 1

| | |
|---|---|
| Polyvinyl alcohol (GL-05, produced by Nippon Gosei Kagaku Co., Ltd.) | 89 parts |
| Water soluble polyamide (P-70, produced by Toray Co., Ltd.) | 10 parts |
| Surfactant (Surfinol 465, produced by Nisshin Kagaku Kogyo Co., Ltd.) | 0.5 parts |
| Water | 900 parts |

After that, the following dyestuff-containing overcoat layer coating solution 1 was coated on the resulting oxygen shielding layer using an applicator, and dried at 75° C. for 1.5 minutes to give a dyestuff-containing overcoat layer with a dry thickness of 0.5 g/m$^2$. Thus, light sensitive planographic printing plate material samples 11 through 14 were prepared.

Dyestuff-Containing Overcoat Layer Coating Solution 1

| | |
|---|---|
| Polyvinyl alcohol (GL-05, produced by Nippon Gosei Kagaku Co., Ltd.) | 78 parts |
| Water soluble polyamide (P-70, produced by Toray Co., Ltd.) | 20 parts |
| Surfactant (F142D, produced by Dainippon Ink and Chemicals, incorporated.) | 0.5 parts |
| Oxonol Red 536 N (produced by PINA) | 2 patrts |
| Water | 900 parts |

Evaluation of Light Sensitive Planographic Printing Plate Material Sample

The light sensitive planographic printing plate material samples 11 through 14 obtained above were processed and evaluated in the same manner as in Example 1 above. The results are shown in Table 2.

TABLE 2

| Sample No. | Photopolymerization initiator used (parts) | Spectral sensitizing dye used (parts) | Sensitivity ($\mu$J/cm$^2$) | Safelight condition | Safelight time (min.) | Remarks |
|---|---|---|---|---|---|---|
| 11 | B-1 (4.0) | C-3 (2.0) | 80 | A | Not less than 60 | Inv. |
| 12 | B-1 (4.0), BR43 (3.0) | C-3 (2.0) | 70 | A | Not less than 60 | Inv. |
| 13 | R-2 (4.0) | C-3 (2.0) | 40 | A | 55 | Inv. |
| 14 | R-2 (4.0), BR43 (3.0) | C-3 (2.0) | 20 | A | 55 | Inv. |
| 11 | B-1 (4.0) | C-3 (2.0) | 80 | B | 7 | Comp. |
| 12 | B-1 (4.0), BR43 (3.0) | C-3 (2.0) | 70 | B | 5 | Comp. |
| 13 | R-2 (4.0) | C-3 (2.0) | 40 | B | 2 | Comp. |
| 14 | R-2 (4.0), BR43 (3.0) | C-3 (2.0) | 20 | B | 1 | Comp. |

Inv. Inventive.
Comp.: Comparative
R-2: η-benzene-(η-cyclopentadienyl)iron·hexafluoroborate As is apparent from Table 2 above, when the sample is handled under the non-yellow safelight in the invention, which is close to white light and which provides working environment under which the sample is easy to handle, the safelight property is greatly improved.

[Effect of the Invention]

The present invention provides a method capable of forming an image on a light sensitive planographic printing plate material with high sensitivity under room light close to white light.

What is claimed is:

1. A method of forming an image on a light sensitive planographic printing plate material comprising a hydrophilic support and provided thereon, a light sensitive layer containing an addition polymerizable ethylenically unsaturated monomer, a photopolymerization initiator, a polymer binder, and a sensitizing dye having an absorption maximum in the wavelength regions of from 390 to 430 nm, the minimum laser exposure amount necessary to form an image on the material being from 1.0 to 100 $\mu$J/cm$^2$, the method comprising the step of:

imagewise exposing the light sensitive planographic printing plate material to laser under a non-yellow safelight to form an image, the non-yellow safelight having an optical filter cutting out light only with a wavelength of less than 440 nm, and emitting a light-yellow light, and satisfying the following expression:

$$0.800 \leq I/I_{700} \leq 1.00$$

wherein $I_{700}$ represents a transmittance of light with a wavelength of 700 nm, and I represents a transmittance of light with a wavelength of from 440 nm to less than 700 nm.

2. The method of claim 1, wherein the laser is a blue-violet semi-conductor laser emitting light with a wavelength of from 390 to 430 nm.

3. The method of claim 1, wherein the photopolymerization initiator is a monoalkyltriarylborate compound.

4. The method of claim 1, wherein the photopolymerization initiator is an iron arene complex.

5. The method of claim 1, wherein the photopolymerization initiator is a bromine containing compound represented by the following formula 1:

$$R_1—CBr_2—(C{=}O)—R_2 \qquad \text{Formula 1}$$

wherein $R_1$ represents a hydrogen atom, a bromine atom, an alkyl group, an aryl group, an acyl group, an alkylsulfonyl group, an arylsulfonyl group or a cyano group; and $R_2$ represents a monovalent substituent, provided that $R_1$ and $R_2$ may combine with each other to form a ring.

6. The method of claim 1, wherein the photopolymerization initiator is a bromine-containing compound represented by the following formula 2:

$$CBr_3—(C{=}O)—X—R_3 \qquad \text{Formula 2}$$

wherein $R_3$ represents a monovalent substituent; and X represents —O— or —$NR_4$—, in which $R_4$ represents a hydrogen atom or an alkyl group, provided that $R_3$ and $R_4$ may combine with each other to form a ring.

7. The method of claim 1, wherein an addition polymerizable ethylenically unsaturated monomer has a tertiary amino group in the molecule.

8. The method of claim 1, wherein an addition polymerizable ethylenically unsaturated monomer is a reaction product of a polyhydric alcohol having a tertiary amino group in the molecule, a diisocyanate compound and a compound having in the molecule a hydroxyl group and an addition polymerizable ethylenically double bond.

9. The method of claim 1, wherein the sensitizing dye is a difluoro(2-acylphenoxy)borane compound.

10. The method of claim 1, wherein the light sensitive planographic printing plate material has an overcoat layer containing a dyestuff on the light sensitive layer, the overcoat layer having an absorption maximum in the wavelength regions exceeding 420 nm, and being transparent to laser used in the imagewise exposure.

* * * * *